United States Patent
Zhao et al.

(10) Patent No.: US 8,202,572 B2
(45) Date of Patent: Jun. 19, 2012

(54) TMR DEVICE WITH IMPROVED MGO BARRIER

(75) Inventors: Tong Zhao, Fremont, CA (US);
Hui-Chuan Wang, Pleasanton, CA (US); Min Li, Dublin, CA (US); Kunliang Zhang, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 38 days.

(21) Appl. No.: 12/927,698

(22) Filed: Nov. 22, 2010

(65) Prior Publication Data

US 2012/0128870 A1     May 24, 2012

(51) Int. Cl.
*H01L 21/00*     (2006.01)
(52) U.S. Cl. .................................. 427/130; 360/324.2
(58) Field of Classification Search ............... 360/324.2; 427/380, 349, 130
See application file for complete search history.

(56) References Cited

U.S. PATENT DOCUMENTS

| | | | |
|---|---|---|---|
| 6,347,049 B1 | 2/2002 | Childress et al. | |
| 6,359,289 B1 * | 3/2002 | Parkin | 257/43 |
| 6,756,128 B2 | 6/2004 | Carey et al. | |
| 6,841,395 B2 | 1/2005 | Linn et al. | |
| 7,635,654 B2 | 12/2009 | Sun et al. | |
| 7,764,539 B2 | 7/2010 | Guo et al. | |
| 7,770,282 B2 | 8/2010 | Zeltser et al. | |
| 7,777,261 B2 | 8/2010 | Huai et al. | |
| 7,780,820 B2 | 8/2010 | Zhao et al. | |
| 2009/0268351 A1 | 10/2009 | Zeltser | |

OTHER PUBLICATIONS

"Giant room-temperature magnetoresistance in single-crystal Fe/MgO/Fe magnetic tunnel junctions," by Shinji Yuasa et al., 2004 Nature Publishing Group, nature materials, vol. 3, Dec. 2004, pp. 868-871, www.nature.com/naturematerials.

"Giant tunnelling magnetoresistance at room temperature with MgO (100) tunnel barriers," by Stuart S.P. Parkin et al., 2004 Nature Publishing Group, nature materials, vol. 3, Dec. 2004, pp. 862-867, www.nature.com/naturematerials.

"230% room-temperature magnetoresistance in CoFeB/MgO/CoFeB magnetic tunnel junctions," by David D. Djayaprawira et al., Applied Physics, Letters 86, 092502, 2005 American Institute of Physics, pp. 1-3.

(Continued)

*Primary Examiner* — Michael Cleveland
*Assistant Examiner* — Tabassom Tadayyon Eslami
(74) *Attorney, Agent, or Firm* — Saile Ackerman LLC; Stephen B. Ackerman

(57) ABSTRACT

A method of forming a high performance magnetic tunnel junction (MTJ) is disclosed wherein the tunnel barrier includes at least three metal oxide layers. The tunnel barrier stack is partially built by depositing a first metal layer, performing a natural oxidation (NOX) process, depositing a second metal layer, and performing a second NOX process to give a $M_{OX1}/M_{OX2}$ configuration. An uppermost metal layer on the $M_{OX2}$ layer is not oxidized until after the MTJ stack is completely formed and an annealing process is performed to drive unreacted oxygen in the $M_{OX1}$ and $M_{OX2}$ layers into the uppermost metal layer. In an alternative embodiment, a plurality of metal oxide layers is formed on the $M_{OX1}$ layer before the uppermost metal layer is deposited. The resulting MTJ stack has an ultralow RA around 1 ohm-$\mu m^2$ and maintains a high magnetoresistive ratio characteristic of a single metal oxide tunnel barrier layer.

20 Claims, 2 Drawing Sheets

OTHER PUBLICATIONS

"Giant tunneling magnetoresistance effect in low-resistance CoFeB/MgO (001)/CoFeB magnetic tunnel junctions for read-head application," by Koji Tsunekawa et al., Applied Physics Letters 87, 072503, 2005 American Institute of Physics, pp. 1-3, Oct. 31, 2004.

"Giant tunneling magnetoresistance up to 410% at room temperature in fully epitaxial Co/MgO/Co magnetic tunnel junctions with bcc Co(001) electrodes," by Shinji Yuasa et al., Applied Physics Letters 89, 042505 (2006), American Institute of Physics, pp. 1-3.

"Ultralow resistance-area product of 0.4 ohms (μm) squared and high magnetoresistance about 50% in CoFeB/MgO/CoFeB magnetic tunnel junctions," by Yoshinori Nagamine et al., Applied Physics Letters 89, 162507 (2006), American Institute of Physics, pp. 1-3.

* cited by examiner

TMR DEVICE WITH IMPROVED MGO BARRIER

RELATED PATENT APPLICATION

This application is related to U.S. Patent Application Publication 2007/0111332; Ser. No. 11/280,523, filed on Nov. 16, 2005 Now U.S. Pat. No. 7,780,820; assigned to a common assignee and herein incorporated by reference in its entirety.

FIELD OF THE INVENTION

The invention relates to a high performance tunneling magnetoresistive (TMR) sensor in a recording head and a method for making the same, and in particular, to a method of forming a tunnel barrier layer between a pinned layer and free layer that improves reliability, decreases the resistance×area (RA) value to about 1 ohm-cm² or less while maintaining a high magnetoresistive (MR) ratio.

BACKGROUND OF THE INVENTION

A TMR sensor serves as a memory element in Magnetic Random Access Memory (MRAM) devices and in magnetic read heads, and typically includes a stack of layers with a configuration in which two ferromagnetic layers are separated by a thin non-magnetic dielectric layer. In a magnetic read head, the TMR sensor is formed between a bottom shield and a top shield, and the tunnel barrier layer must be extremely uniform in thickness and oxidation state since small thickness variations or slight oxidation differences result in large resistance variations that degrade device performance. In a MRAM device, the TMR sensor is formed between a bottom conductor and a top conductor.

The TMR sensor is also referred to as a magnetic tunnel junction (MTJ) and may have a bottom spin valve configuration wherein a seed layer, anti-ferromagnetic (AFM) layer, pinned layer, tunnel barrier, free layer, and cap layer are sequentially formed on a substrate. The pinned layer has a magnetic moment that is fixed by exchange coupling with the adjacent AFM layer that is magnetized in an in-plane direction. The free layer has an in-plane magnetic moment that is generally perpendicular to that of the pinned layer but is free to rotate 180 degrees under the influence of an external magnetic field generated by passing a current between the bottom shield and top shield in a direction perpendicular to the planes of the MTJ layers. A thin tunnel barrier layer is used so that a current through it can be established by quantum mechanical tunneling of conduction electrons. It is the relative orientation of the magnetic moments between the free and pinned layers that determines the tunneling current and therefore the resistance of the tunneling junction. A sense current detects either a lower resistance ("0" memory state) or a high resistance ("1" memory state) depending on the relative magnetic orientation of the pinned and free layers.

A TMR sensor is currently the most promising candidate for replacing a giant magnetoresistive (GMR) sensor in upcoming generations of magnetic recording heads. An advanced TMR sensor may have a cross-sectional area of about 0.1 microns×0.1 microns or less at the air bearing surface (ABS) plane of the read head. The advantages of a TMR sensor are a higher MR ratio and the preference for current perpendicular to plane (CPP) geometry for high recording density. A high performance TMR sensor requires a low RA (resistance×area) value, high MR ratio, a soft free layer with low magnetostriction ($\lambda$), a strong pinned layer, and low interlayer coupling through the barrier layer. The MR ratio is dR/R where R is the minimum resistance of the TMR sensor and dR is the change in resistance observed by changing the magnetic state of the free layer. A higher dR/R improves the readout speed. For very high recording density or high frequency applications, RA must be reduced to about 1 ohm-um² or less. As a consequence, MR ratio drops significantly. To maintain a reasonable signal-to-noise (SNR) ratio and improved reliability (longer lifetime), a MTJ that provides both of a high MR ratio and ultra low RA value ($\leq 1$ ohm-um²) is desirable.

A very high MR ratio has been reported by Yuasa et. al in "Giant room-temperature magnetoresistance in single crystal Fe/MgO/Fe magnetic tunnel junctions", Nature Materials 3, 868-871 (2004) and is attributed to coherent tunneling. Parkin et al in "Giant tunneling magnetoresistance at room temperature with MgO (100) tunnel barriers", Nature Materials 3, 862-867 (2004) demonstrated that an MR ratio of about 200% can be achieved with epitaxial Fe(001)/MgO(001)/Fe(001) and polycrystalline FeCo(001)/MgO(001)/($Fe_{70}Co_{30}$)$_{80}B_{20}$ MTJs at room temperature. In addition, Djayaprawira et. al described a high MR ratio of 230% with advantages of better flexibility and uniformity in "230% room temperature magnetoresistance in "CoFeB/MgO/CoFeB magnetic tunnel junctions", Physics Letters 86, 092502 (2005). However, RA values in the MTJs mentioned above are in the range of 240 to 10000 ohm-um² which is too high for read head applications. Tsunekawa et. al in "Giant tunneling magnetoresistance effect in low resistance CoFeB/MgO(001)/CoFeB magnetic tunnel junctions for read head applications", Applied Physics Letters 87, 072503 (2005) found a reduction in RA by inserting a DC-sputtered metallic Mg layer between a bottom CoFeB layer and rf-sputtered MgO. The Mg layer improves the crystal orientation of the MgO(001) layer when the MgO (001) layer is thin. The MR ratio of CoFeB/Mg/MgO/CoFeB MTJs can reach 138% at RA=2.4 ohm-um². The idea of metallic Mg insertion was initially disclosed by Linn in U.S. Pat. No. 6,841,395 to prevent oxidation of the bottom electrode (CoFe) in a CoFe/MgO(reactive sputtering)/NiFe structure.

Although a high MR ratio and low RA have been demonstrated in MTJs having a MgO barrier layer, there are still many issues to be resolved before such configurations can be implemented in a TMR sensor of a read head. For example, the annealing temperature needs to be lower than 300° C. for read head processing, and rf-sputtered MgO barriers make control of RA mean and uniformity more difficult than with conventional DC-sputtered and subsequently naturally oxidized AlOx barriers. Moreover, a CoFe/NiFe free layer is preferred over CoFeB for low X and soft magnetic properties but when using a CoFe/NiFe free layer in combination with a MgO barrier, the MR ratio will degrade to very near that of a conventional AlOx MTJ. Thus, a TMR sensor is needed that incorporates MgO or other metal oxide barriers without compromising any desirable properties such as high MR ratio, a low RA value, and low magnetostriction.

A barrier layer comprised of $TiO_xN_y$ and MgO is disclosed in U.S. Pat. No. 6,756,128. In U.S. Pat. No. 6,347,049, MgO/$Al_2O_3$/MgO and $Al_2O_3$/MgO/$Al_2O_3$ are disclosed as tunnel barrier layers having low RA values.

In U.S. Patent Application Publication 2009/0268351, a tunnel barrier is described as having a multilayer structure with individual layers of MgO formed by reactive sputtering of MgO or by natural oxidation of Mg layers.

SUMMARY OF THE INVENTION

One objective of the present invention is to provide a TMR sensor with a multilayer tunnel barrier that enables a low RA of about 1 ohm-$\mu m^2$ or less while maintaining a high MR ratio that is characteristic of a single MgO tunnel barrier layer.

A second objective of the present invention is to provide the TMR sensor according to the first objective without limiting device throughput.

According to a first embodiment, these objectives are achieved by forming a TMR sensor comprised of at least a free layer, a pinned layer, and a tunnel barrier layer between the pinned and free layers wherein the tunnel barrier is a multilayer structure having multiple metal oxide layers. In a bottom spin valve scheme with a pinned layer/tunnel barrier/free layer configuration, the first metal oxide layer ($M_{OX1}$) adjoining the pinned layer preferably has a greater thickness than a second metal oxide layer ($M_{OX2}$) which in turn has a greater thickness than a third metal oxide layer ($M_{OX3}$) to give a $M_{OX1}/M_{OX2}/M_{OX3}$ configuration where M is one of MgZn, Zn, Al, Ti, AlTi, Hf, or Zr. Each metal layer is deposited and oxidized with a natural oxidation (NOX) treatment before a subsequent metal layer is laid down. However, the uppermost metal layer is not treated with NOX. It is transformed into an oxide by oxygen diffusion from underlying layers mostly during an annealing process. Preferably, the first metal (M1) layer is deposited with a thickness greater than 4 Angstroms in order to provide a continuous layer which is essentially free of pinholes. The uppermost metal oxide layer is preferably the thinnest to avoid overoxidation that could lead to oxygen diffusion into the adjoining free layer. Alternatively, a fourth metal oxide layer ($M_{OX4}$) is formed on the $M_{OX3}$ layer to give a $M_{OX1}/M_{OX2}/M_{OX3}/M_{OX4}$ tunnel barrier structure wherein each of the $M_{OX3}$ and $M_{OX4}$ layers is made from a metal layer having a thickness less than the thickness of the M1 and M2 layers. Thus, $M_{OX1}$ is derived from the M1 layer, $M_{OX2}$ is an oxidized M2 layer, and so forth wherein the relative thickness of the layers is in the order $M_{OX1}>M_{OX2}>M_{OX3}$, $M_{OX4}$. In another embodiment, more than four metal oxide layers may be employed.

In one aspect, the TMR sensor may have a configuration represented by seed layer/AFM layer/pinned layer/tunnel barrier/free layer/cap layer wherein the pinned layer has a synthetic anti-ferromagnetic (SyAF) structure comprised of an AP2/coupling/AP1 configuration in which the coupling layer is Ru. Typically, the TMR stack of layers including the multiple M layers in the tunnel barrier are laid down in a sputter deposition system. A key feature is that all of the M layers except for the last metal layer deposited are oxidized with a natural oxidation (NOX) method. Furthermore, the pinned layer in a bottom spin valve configuration may be treated with Ar plasma or a light oxidation prior to depositing the first M layer in order to improve the interface between the pinned layer and first M layer. Also, the uppermost M layer may be treated with Ar plasma, a low dose of oxygen, an Ar/O2 mixture, or other inert gas mixtures before the free layer is sputter deposited. One purpose of these treatments is to minimize metal inter-diffusion at the interface between free layer and tunnel barrier. Another purpose is to form better bonding between Mg and oxygen before depositing the free layer. A subsequent anneal step essentially forms a uniform metal oxide layer. The aforementioned plasma or gas treatments are advantageous in forming a smoother and more uniform tunnel barrier layer and sharper interfaces that may help to improve dR/R and/or other device performance.

DETAILED DESCRIPTION OF THE INVENTION

Figure 1:
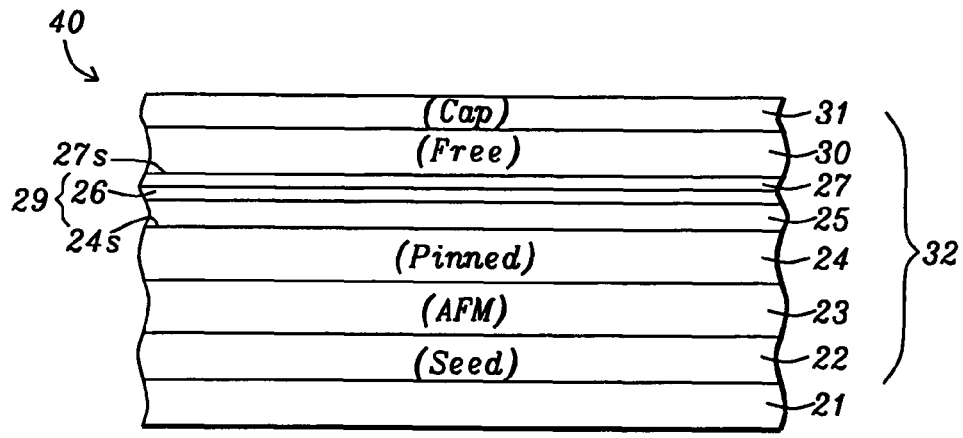
FIG. 1 is a cross-sectional view showing a TMR sensor that is formed according to a first embodiment of the present invention.

The present invention is a high performance TMR sensor having a tunnel barrier layer comprised of multiple metal oxide layers and a method for making the same. The TMR sensor configurations described herein may be employed in a magnetic recording head, in MRAM devices, or in other film structures involving oxidation or nitridation of metal layers. In other words, for tunnel barriers or other layers comprised of an oxynitride or nitride composition, multiple metal layers may be deposited and nitrided or oxynitrided in the same fashion as the tunnel barrier fabrication sequence of the present invention. Although the exemplary embodiments depict bottom spin valve structures, the present invention also encompasses top spin valve and multilayer spin value configurations as understood by those skilled in the art. The drawings are provided by way of example and are not intended to limit the scope of the invention.

In U.S. Patent Application Publication 2007/0111332, we disclosed a method of forming a low resistance TMR sensor with a process comprising the deposition of a first Mg layer, performing a natural oxidation, and then depositing a second Mg layer on the oxidized first Mg layer to give a MgO/Mg bilayer. A subsequent annealing step causes further oxygen diffusion from MgO into the Mg layer to produce an essentially uniform MgO tunnel barrier layer that results in a low RA value of around 2 ohm-$\mu m^2$ without compromising the MR ratio. With the continuing demand for higher density recording and storage devices, the RA value must be further reduced to about 1 ohm-$\mu m^2$ or less to meet performance requirements. To achieve a lower RA with the aforementioned MgO/Mg bilayer process, one can thin the tunnel barrier thickness and/or reduce the natural oxidation (NOX) "dose" which means less oxidation time and/or lower oxygen pressure. However, the bilayer has limitations with regard to low RA extendibility. For example, simply reducing the NOX dose without adjusting Mg thickness will lower dR/R (MR ratio) and degrade device stability due to underoxidation. Furthermore, reducing the total Mg thickness leads to a lower breakdown voltage, and device lifetime is likely to suffer. Therefore, no acceptable pathway to a TMR sensor with an ultra low RA and high MR ratio exists with a single MgO layer or a bilayer MgO/Mg configuration.

In order to simultaneously achieve an ultra low RA value of about 1 ohm-$\mu m^2$ or less without degrading the MR ratio, we have surprisingly discovered that the tunnel barrer layer thickness may be kept constant compared with the previously disclosed bilayer structure by increasing the number of metal oxide layers within the tunnel barrier stack. When the number of MgO or other metal oxide layers below the upper Mg (or other metal layer) is at least two or three prior to the annealing step, we find substantially improved tunnel barrier uniformity and performance. According to one embodiment, a tunnel barrier stack comprised of a $MgO_1/MgO_2/MgO_3/Mg$ or $MgO_1/MgO_2/Mg$ configuration may be formed before an annealing step converts the stack to a final oxidized state represented by $MgO_1/MgO_2/MgO_3/MgO_4$ or $MgO_1/MgO_2/$ MgO$_3$, respectively, where the number refers to the order of formation in the stack. In addition, a plasma or light oxidation treatment of the substrate may be performed before the metal layer is laid down, and/or a plasma or light oxidation treatment of the upper unoxidized metal layer may be performed before the free layer and pinned layer are deposited and annealing is performed to further improve tunnel barrier smoothness and interface sharpness. Alternatively, Mg may be replaced by other metals or metal alloys as explained later to generate $M_{OX1}/M_{OX2}/M_{OX3}$ or $M_{OX1}/M_{OX2}/M_{OX3}/M_{OX4}$ configurations.

Referring to FIG. 1, a portion of a partially formed magnetic device 40 of the present invention is shown from the plane of an air bearing surface (ABS). There is a substrate 21 that in a magnetic recording head embodiment is a bottom lead otherwise known as a bottom shield (S1) which may be a NiFe layer, for example, that is formed by a conventional method on a substructure (not shown). It should be understood that the substructure is typically comprised of a first gap layer disposed on a wafer made of AlTiC, for example. In a MRAM embodiment, the substrate may be a bottom electrode.

A TMR stack 32 is formed on the substrate 21 and in the exemplary embodiment has a bottom spin valve configuration wherein a seed layer 22, AFM layer 23, and a pinned layer 24 are sequentially formed on the substrate as the bottom portion of the TMR stack. The seed layer 22 may be made of Ta/Ru, Ta, Ta/NiCr, Ta/Cu, Ta/Cr, or other materials used in the art. The seed layer 22 serves to promote a smooth and uniform grain structure in overlying layers. Above the seed layer 22 is an AFM layer 23 used to pin the magnetization direction of the overlying pinned layer 24. The AFM layer 23 is preferably one of IrMn, MnPt, NiMn, OsMn, RuMn, RhMn, PdMn, RuRhMn, or MnPtPd.

The pinned layer 24 may have a synthetic anti-parallel (SyAP) configuration (not shown) represented by AP2/Ru/AP1. The AP2 layer (outer pinned layer) is formed on the AFM layer 23 and may be made of CoFe or other ferromagnetic materials. The magnetic moment of the AP2 layer is pinned in a direction anti-parallel to the magnetic moment of the AP1 layer. A slight difference in thickness between the AP2 and AP1 layers produces a small net magnetic moment for the SyAP pinned layer 24 along the easy axis direction of the TMR sensor to be patterned in a later step. Exchange coupling between the AP2 layer and the AP1 layer is facilitated by a coupling layer that is preferably comprised of Ru with a thickness of from 3 to 9 Angstroms although Rh or Ir may be used instead of Ru. In a preferred embodiment, the AP1 layer (inner pinned layer) is one or more of CoFe, CoFeB, CoNiFe, CoNiFeB, or alloys thereof with other elements such as Ta, Ru, Mg, Hf, Zr, Zn, W, Cu, Ag, and Au, and is formed on a Ru coupling layer which is about 7.5 Angstroms thick. Note that "inner pinned layer" is meant to indicate the portion of the pinned layer that is closest to the barrier layer and "outer pinned layer" is meant to signify the portion of the pinned layer farthest from the barrier layer.

In the exemplary embodiment (FIG. 1) that features a TMR sensor with a bottom spin valve configuration, the tunnel barrier layer 29 is a stack of layers 25-27 formed on the top surface 24s of the pinned layer 24, and there is a free layer 30 and cap layer 31 sequentially formed on the tunnel barrier. In a top spin valve configuration (not shown), the TMR stack 32 according to the present invention would involve the sequential deposition of a seed layer 22, free layer 30, tunnel barrier layer 29, pinned layer 24, AFM layer 23, and cap layer 31 on the substrate 21. In a top spin valve, the AP1 layer (inner pinned layer) is disposed on the uppermost layer 27 in the tunnel barrier stack.

A key feature of the present invention according to a preferred embodiment is the formation of a tunnel barrier layer 29 having multiple metal oxide layers on the inner (AP1) portion of the pinned layer 24. Preferably, a sequence of at least three metal or alloy (M) layers is laid down and after each metal or alloy deposition except for the uppermost and final M layer, a natural oxidation process is performed to convert M into an $M_{OX}$ layer where (OX) indicates an oxidized state. However, the number of metal layers used to form the tunnel barrier may be more than three or four. M may be selected from Mg, MgZn, Zn, Al, Ti, AlTi, Hf, Zr or a combination thereof. Preferably, the first metal (M1) layer deposited has a thickness greater than the second (M2) metal layer while third and subsequent (M3, M4, ... Ms) metal layers have a thickness less than the M2 layer thickness. According to one embodiment, M1 has a thickness between 4 to 8 Angstroms, M2 thickness is from 2 to 4 Angstroms, and M3 to Ms layers have a 0.5 to 3 Angstrom thickness where s is an integer >4. Preferably, the combined thickness of all M layers is less than 10 Angstroms for an RA less than 1 ohm-cm$^2$.

The M1 layer has a greater thickness than other M layers, and preferably greater than 4 Angstroms in order to generate a continuous metal layer free of pinholes before the first $M_{OX}$ layer is formed. The formation of at least three $M_{OX}$ layers provides an advantage over a bilayer scheme in that a more uniform tunnel barrier is produced. It should be understood that as a metal layer thickness increases, a stronger NOX dose (longer oxidation time and/or higher oxygen pressure) is required to oxidize the layer. Therefore, according to one embodiment of the present invention where relative thickness is in the order M1>M2>M3, and M3 becomes fully oxidized during an annealing step, the NOX dose for the M1 layer is higher than for M2. In a second embodiment wherein relative thickness is on the order M1>M2>M3, M4, and M4 becomes fully oxidized during a subsequent annealing step, the NOX dose for M1 is higher than for M2, and M2 NOX dose is higher than that for M3. As described in related patent application Ser. No. 11/280,523, the Mg layer in a MgO/Mg bilayer stack may be fully oxidized during an anneal process after the TMR stack is formed. Similarly, the uppermost M3, M4, or Ms layer where s is an integer >4 in the present invention is oxidized during an anneal step after all layers in the TMR sensor stack have been formed. This oxidation sequence minimizes the chance of overoxidation in the uppermost $M_{OX}$ layer since NOX of an uppermost M layer is likely to result in excess oxygen absorbed within the resulting $M_{OX}$ layer that can subsequently diffuse into the free layer and cause oxidation therein. It is believed that there is enough oxygen in the TMR sensor and especially within the $M_{OX}$ sub-layers to diffuse into the uppermost M layer during the anneal step and cause essentially complete oxidation therein.

We have also discovered that tunnel barrier uniformity may be further improved by performing a plasma treatment with an inert gas such as Ar, or with a light natural oxidation (NOX) of top surface 24s prior to depositing the M1 layer. Although the mechanism is not completely understood, we have found that a plasma treatment with Ar or the like causes the subsequent growth of a Mg (or another metal layer) to occur more uniformly which leads to a more uniform tunnel barrier layer. A typical Ar plasma treatment comprises a RF power of 10 to 50 Watts and a pressure of 1E-4 to 1 Torr. A light oxidation is defined as exposure of top surface 24s to oxygen at a pressure of 0.001 to 0.01 mTorr for a time of 10 to 600 seconds in an oxidation chamber of a sputter deposition mainframe, for example. Shorter or longer oxidation times are not preferred because of a loss of process control or slower throughput. Thus, a smoother pinned layer 24 results in a more uniform M1 layer and better uniformity in all M layers. As a result, the oxidized tunnel barrier structure will have significantly higher uniformity in each $M_{OX}$ layer that translates into lower RA without compromising the MR ratio.

In one embodiment as illustrated in FIG. 1, the M1 layer is oxidized to $M_{OX1}$ (layer 25) followed by deposition of an M2 layer and oxidation to $M_{OX2}$ (layer 26) followed by deposition of an M3 layer wherein all oxidations are NOX processes. Note that the M3 layer becomes a $M_{OX3}$ layer 27 during a subsequent anneal step when oxygen from layers 25, 26 diffuses into the uppermost M3 layer. Usually, for M layer thicknesses between 0.5 and 8 microns, the NOX process comprises an oxygen pressure of 0.1 mTorr to 1 Torr for about 15 to 300 seconds in an oxidation chamber of a sputter deposition mainframe. Moreover, the gas composition may include an inert gas such as Ar, Xe, or Ne in addition to oxygen.

Figure 2:
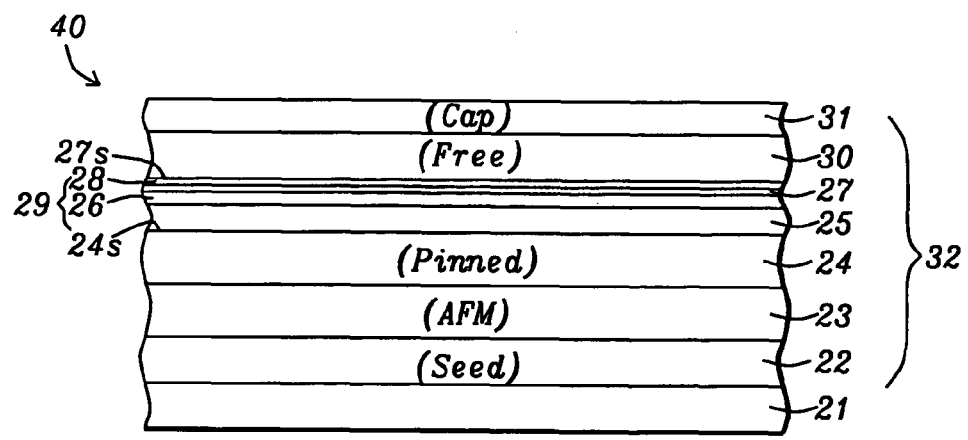
FIG. 2 is a cross-sectional view depicting a TMR sensor that is formed according to a second embodiment of the present invention.
Figure 3:
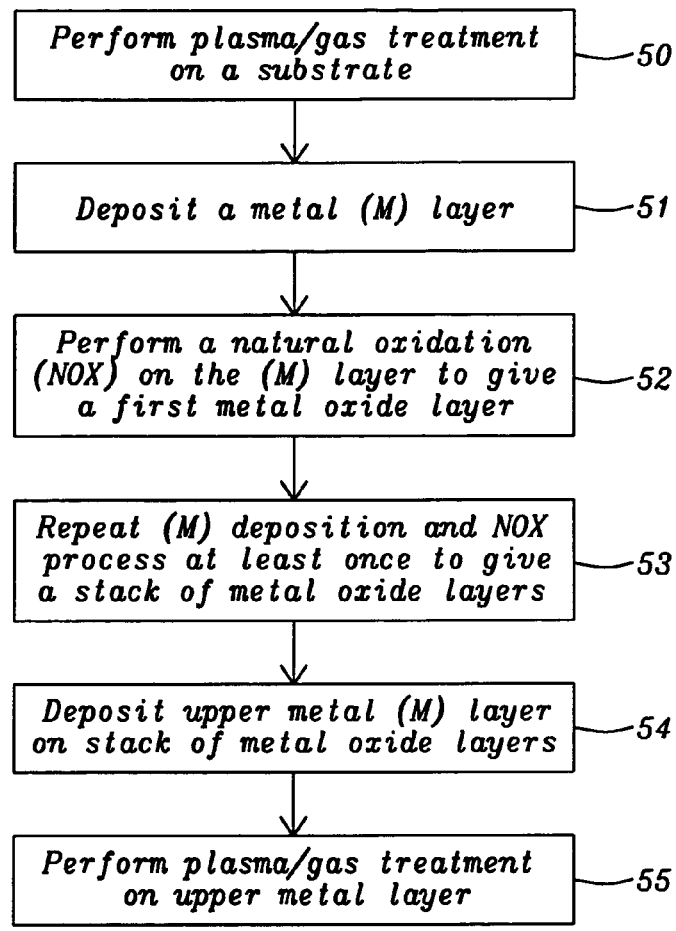
FIG. 3 is a process flow diagram that depicts the steps involved in forming a tunnel barrier layer according to one embodiment of the present invention.

A process flow diagram is provided in FIG. 3. A plasma treatment with an inert gas may be performed in step 50 on a substrate in a DC sputtering chamber of a sputtering system such as an Anelva C-7100 sputter deposition system which includes ultra high vacuum DC magnetron sputter chambers. Although the exact mechanism is not understood, the plasma treatment results in a more uniform growth of the first M layer that in turn leads to a more uniform tunnel barrier. Alternatively, step 50 may comprise a light natural oxidation of the substrate to promote a better interface between the substrate and the first M layer to be deposited in the following step. The oxygen in step 50 is absorbed on the surface of the substrate and reacts with a bottom portion of the subsequently deposited first M layer. In this context, "light" oxidation means a condition that does not cause the substrate to become oxidized. In one aspect relating to a bottom spin valve configuration and FIGS. 1-2, the substrate in step 50 is the pinned layer 24. Alternatively, step 50 may be omitted and tunnel barrier formation begins with step 51 wherein a first M layer is deposited on the substrate which is pinned layer 24 in the exemplary embodiments. Typically, the sputter deposition process involves an argon sputter gas and a base pressure between $5 \times 10^{-8}$ and $5 \times 10^{-9}$ torr. Each sputter chamber has multiple targets which are low pressure discharge cathodes. A lower pressure enables more uniform films to be deposited.

The next step in the tunnel barrier layer formation sequence is a previously described natural oxidation (NOX) process (step 52) whereby the first M layer deposited in step 51 is converted to a first $M_{OX}$ layer 25. Typically, no heating or cooling is applied to the oxidation chamber during the NOX process. It should be noted that oxygen pressures below 0.1 mTorr are not recommended during NOX processes because of tool limitations. On the other hand, an ultra low RA value of about 1 ohm-um$^2$ or less becomes difficult to achieve if the oxygen pressure increases above 1 Torr.

In step 53 (FIG. 3), the sequence of a metal deposition followed by a natural oxidation in steps (51, 52) is repeated at least one more time. According to one embodiment as depicted in FIG. 1, step 53 comprises the deposition of a second metal (M) layer and then natural oxidation to give a second $M_{OX}$ layer 26 on layer 25. Preferably, the second $M_{OX}$ layer 26 is thinner than the first $M_{OX}$ layer 25. Thereafter, in step 54 a third metal (M) layer is deposited on the second $M_{OX}$ layer. The third M layer remains in a substantially unoxidized state during optional step 55 wherein an inert plasma or light oxidation treatment is performed. Again, the inert gas/oxygen treatment of the top surface of the uppermost M layer leads to a better interface with a subsequently deposited free layer.

Once the free layer and cap layer are deposited on the upper M layer, an annealing step is performed which converts the upper M layer to a third $M_{OX}$ layer 27. The upper M layer has a thickness between 0.5 and 3 Angstroms before oxidation and serves to protect the subsequently deposited free layer from oxidation. It is believed that excessive oxygen accumulates within one or more of the first $M_{OX}$ layer 25 and second $M_{OX}$ layer 26 as a result of previous NOX processes and this oxygen could diffuse into and oxidize a free layer that is formed directly on a metal oxide that has been generated by a NOX (or radical oxidation) process. In effect, the uppermost M layer intercepts the oxygen that diffuses out of the MOX sub-layers by reacting with the oxygen to form a substantially oxidized uppermost $M_{OX}$ layer in the tunnel barrier stack.

Note that the RA and MR ratio for the TMR sensor stack 32 may be adjusted by varying the thickness of the upper M layer (and resulting $M_{OX}$ layer 27) and by varying the natural oxidation time and pressure of each NOX step. Preferably, the tunnel barrier 29 should not be overoxidized which will drive up RA to undesirable values, or underoxidized which lowers dR/R and causes lower device stability. Underoxidized is defined as a condition where a significant portion of the metal atoms in any of the $M_{OX}$ layers remain unoxidized or in a low oxidation state while overoxidation means essentially all of the metal atoms in the $M_{OX}$ layers are in a fully oxidized state and there is additional oxygen bound to the $M_{OX}$ layers or contained within at least one $M_{OX}$ layer that is free to diffuse into adjacent layers.

Returning to FIG. 2, tunnel barrier 29 is fabricated with the same set of processes as described with respect to the first embodiment (FIG. 1). However, the second embodiment of the present invention further comprises at least a third sequence of step 51 followed by step 52 thereby forming a stack of three $M_{OX}$ layers 25-27. As in the first embodiment, the second $M_{OX}$ layer 26 is preferably thinner than the first $M_{OX}$ layer 25. Moreover, the third M layer generally has a thickness less than the second M layer to accommodate a weaker (NOX) oxidation and avoid an overoxidized state where excess oxygen within the resulting third $M_{OX}$ layer 27 could diffuse into the overlying free layer 30 during a subsequent anneal step. Thus, the present invention anticipates that the third MOX layer 27 may be oxidized with a weaker NOX dose which means a lower oxygen pressure and/or less oxidation time compared with the oxidation of the first two M layers. In this embodiment, step 54 comprises the deposition of a fourth M layer on the third $M_{OX}$ layer 27. The uppermost M layer becomes fully oxidized to $M_{OX}$ layer 28 during a subsequent annealing step. The upper $M_{OX}$ layer 28 has a top surface 28s.

In an embodiment wherein an alloy of MgZn or AlTi is selected for at least one M layer, the alloy may be sputter deposited using a MgZn or AlTi target, or by using separate Mg and Zn (or Al and Ti) targets.

Once the $M_{OX1}/M_{OX2}/M_3$ or $M_{OX1}/M_{OX2}/M_{OX3}/M_4$ tunnel barrier structure is built at an intermediate stage of the TMR fabrication scheme according to first and second embodiments, respectively, a free layer 30 is formed on the uppermost M layer and is comprised of one or more of the materials previously described with respect to the AP1 portion of pinned layer 24. Above the free layer is a cap layer 31 that may have a Ru/Ta/Ru or Ru/Ta configuration, for example. In one embodiment, the free layer 30 and cap layer 31 are deposited in the same sputtering chamber as layers 22-24. Optionally, more than one sputter deposition chamber may be used to deposit the layers in TMR stack 32.

Once the TMR stack 32 is complete, the partially formed magnetic device 40 may be annealed in a vacuum oven within the range of 250° C. to 350° C. with an applied field of at least 5000 Oe for a period of 2 to 10 hours to set the pinned layer and free layer magnetization directions. It should be understood that depending upon the time and temperature involved in the anneal process, unreacted oxygen in the underlying $M_{OX}$ layers diffuses into the uppermost M layer and causes substantial if not total oxidation therein. Although a certain number of metal atoms may remain unoxidized, the uppermost layer in the tunnel barrier stack is still considered to be in a fully oxidized ($M_{OX}$) state.

Figure 4:
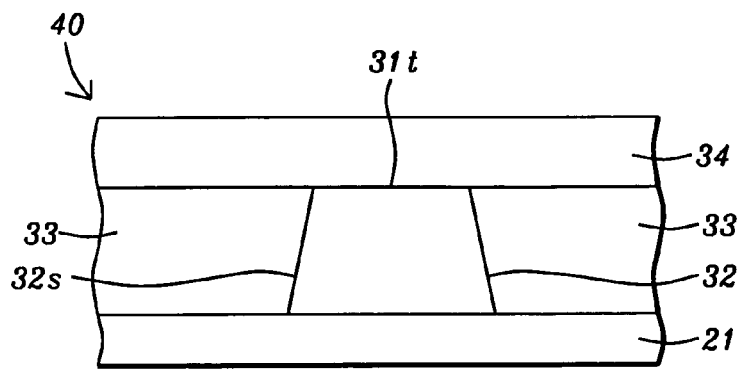
FIG. 4 is a cross-sectional view of a TMR sensor stack of layers that has been patterned to generate a sidewall, and a top surface that contacts an overlying top electrode or top shield.

Referring to FIG. 4, the TMR stack 32 is patterned by following a conventional process sequence. For example, a photoresist layer (not shown) may be formed on the cap layer 31. After the photoresist layer is patterned to form openings that uncover certain regions of cap layer 31, an ion beam etch (IBE) or reactive ion etch (RIE) sequence may be employed to remove underlying portions of layers in the TMR stack that are exposed by openings in the photoresist layer. In the exemplary embodiment, the etch process stops on the substrate 21 to give a TMR sensor 32 with a top surface 31t and sidewalls 32s. Thereafter, an insulating layer 33 may be deposited along the sidewalls of the TMR sensor. The photoresist layer is removed by a well known lift off process. Alternatively, in a magnetic recording head embodiment, a bias structure (not shown) may be formed within an insulation layer and proximate to sidewall 32s to keep the magnetization direction of the free layer oriented in an in-plane direction.

According to one embodiment relating to a magnetic recording head, a top lead otherwise known as a top shield 34 is then deposited on the insulating layer 33 and TMR element 32. Similar to the bottom shield 21, the top shield 34 may also be a NiFe layer about 2 microns thick. The TMR read head 40 may be further comprised of a second gap layer (not shown) disposed on the top shield 34.

In an MRAM embodiment, a top conductor 34 such as a bit line is formed on a top surface 31t of the TMR element 32.

An experiment was conducted to demonstrate the improved performance achieved by implementing a tunnel barrier layer in a TMR sensor stack formed according to an embodiment of the present invention. As a reference, a TMR stack of layers identified as Example A was prepared according to a MgO/Mg bilayer process previously disclosed in U.S. Patent Application Publication 2007/0111332. Additional samples shown as Example B and Example C were fabricated according to first and second embodiments, respectively, of the present invention. In all Examples, the TMR stack has the same structure except for the tunnel barrier layer as summarized in Table 1. In particular, a Ta/Ru/IrMn/CoFe/Ru/FeCoB/tunnel barrier/CoFe/CoFeB/CoFeBTa/NiFe/Ru/Ta configuration is used and comprises a Ta/Ru seed layer, IrMn AFM layer, CoFe/Ru7.5/CoFe pinned layer, CoFe3/CoFeB20/CoFeBTa8/NiFe40 free layer, and a Ru10/Ta60 capping layer. The thickness of each layer is shown following the composition of the layer. The TMR stack was formed on a NiFe substrate and was annealed under vacuum at 280° C. for 5 hours with an applied field of 8000 Oe. The advantages of the present invention are that an ultra low RA value of around 1 ohm-um$^2$ is realized while maintaining a high MR ratio of about 60% similar to the MTJ where the tunnel barrier is a bilayer structure (Example A), and without affecting free layer magnetic properties. In Example C, where four MgO layers are formed within the tunnel barrier following a process sequence that ends with an anneal step, a MR ratio of 62% was achieved with a RA value of 1.0 ohm-um$^2$ in a 0.6 um circular device. The NOX process applied in the examples involves an oxygen pressure of about 0.001 to 1 mTorr for 5 to 100 seconds depending on the thickness of the Mg layer to be oxidized.

TABLE 1

MR Ratio and RA values of MTJs with different tunnel barrier structure in Ta/Ru//IrMn/CoFe24/Ru7.5/CoFe23/barrier/CoFe3/CoFeB20/CoFeBTa8/NiFe40/Ru/Ta

| Film Type | Tunnel Barrier structure | RA | dR/R |
|---|---|---|---|
| Example A | Mg5.5/NOX/Mg3 | 1.1 | 61% |
| Example B | Mg5/NOX/Mg3/NOX/Mg0.5 | 1.1 | 62% |
| Example C | Mg5/NOX/Mg3/NOX/Mg0.5 | 1.0 | 60% |
| Example D | Mg4.5/NOX/Mg3/NOX/Mg0.5/NOX/Mg0.5 | 1.0 | 62% |

Example B (in comparison with Example A) and Example D (in comparison with Example C) demonstrate that more lamination of a barrier layer gives better dR/R with the same RA for an overall improvement in barrier quality. Also, Example D (in comparison with Example A) demonstrates that a lower RA value and higher dR/R can be achieved with a tunnel barrier including four metal oxide layers compared with a prior art bilayer scheme. As a result of better barrier quality, device stability, lifetime, and signal to noise ratio (SNR) are all improved by implementing a multilayer metal oxide tunnel barrier stack according to the present invention. The total thickness of the tunnel barrier layer can be kept at previous levels to avoid a change to a thinner tunnel barrier that would lead to a lower breakdown voltage. It should be understood that the advantages described herein are achieved without any significant loss in throughput since the extra metal deposition and natural oxidation steps represent minimal adjustments in the overall fabrication scheme.

While this invention has been particularly shown and described with reference to, the preferred embodiment thereof, it will be understood by those skilled in the art that various changes in form and details may be made without departing from the spirit and scope of this invention.

We claim:

1. A method of forming a tunnel barrier in a magnetic tunnel junction (MTJ), comprising:
   (a) providing a substrate and subjecting said substrate to a natural oxidation process or to a plasma treatment with an inert gas;
   (b) depositing a first metal layer having a first thickness that forms a continuous film on the substrate;
   (c) performing a natural oxidation (NOX) process to convert said first metal layer to a first metal oxide ($M_{OX1}$) layer;
   (d) repeating the metal deposition and NOX process one or more times to form a stack including one or more metal oxide layers on the $M_{OX1}$ layer wherein a second metal layer that is oxidized to a second metal oxide layer ($M_{OX2}$), and contacts a surface of the $M_{OX1}$ layer has a thickness less than the first thickness;
   (e) depositing an uppermost metal layer on the stack of one or more metal oxide layers wherein the uppermost metal layer has a thickness less than the thickness of the second metal layer; and
   (f) performing an annealing process that causes oxygen from the metal oxide layers to diffuse into the uppermost metal layer thereby fully oxidizing the uppermost M layer to an uppermost $M_{OX}$ layer and forming a tunnel barrier having a stack of at least three metal oxide layers.

2. The method of claim 1 wherein the MTJ is part of a magnetic recording head or a MRAM device.

3. The method of claim 1 wherein the MTJ has a bottom spin valve configuration wherein the substrate is a pinned layer comprising one or more of CoFe, CoFeB, CoNiFe, CoNiFeB, or alloys thereof with other elements selected from Ta, Ru, Mg, Hf, Zr, Zn, W, Cu, Ag, and Au.

4. The method of claim 3 further comprised of sequentially forming a free layer and a capping layer on the uppermost metal layer before performing the annealing process.

5. The method of claim 1 wherein M is selected from Mg, MgZn, Zn, Al, Ti, AlTi, Hf, Zr or a combination thereof.

6. The method of claim 1 wherein the plasma treatment is comprised of Ar and provides a substrate surface that promotes uniform growth in the first metal layer.

7. The method of claim 1 wherein the first thickness of the first metal layer is between about 4 and 8 Angstroms, the second metal layer has a thickness from about 2 to 4 Angstroms, and the uppermost metal layer has a thickness from about 0.5 to 3 Angstroms.

8. The method of claim 1 further comprised of performing a plasma treatment with an inert gas on the uppermost metal layer before performing the annealing process.

9. The method of claim 1 further comprised of performing a natural oxidation of the uppermost metal layer that partially oxidizes the uppermost metal layer before performing the annealing process.

10. The method of claim 1 wherein said annealing process comprises a temperature from about 250° C. to 350° C. and an applied magnetic field of at least 5000 Oe for a period of about 2 to 10 hours.

11. A method of forming a tunnel barrier in a magnetic tunnel junction (MTJ), comprising:
(a) depositing a first metal layer having a first thickness that forms a continuous film on a substrate;
(b) performing a natural oxidation (NOX) process to convert said first metal layer to a first metal oxide ($M_{OX1}$) layer;
(c) performing a metal deposition followed by a NOX process one or more times to form a stack including one or more metal oxide layers on the $M_{OX1}$ layer wherein a second metal layer that is oxidized to a second metal oxide layer ($M_{OX2}$), and contacts a surface of the $M_{OX1}$ layer has a thickness less than the first thickness;
(d) depositing an uppermost metal layer on the stack of one or more metal oxide layers wherein the uppermost metal layer has a thickness less than the thickness of the second metal layer;
(e) depositing one or more additional layers including at least one ferromagnetic layer on the uppermost metal layer to form a MTJ stack of layers; and
(f) performing an annealing process that causes oxygen from the metal oxide layers to diffuse into the uppermost metal layer thereby fully oxidizing the uppermost M layer to an uppermost $M_{OX}$ layer and forming a tunnel barrier having a stack of at least three metal oxide layers.

12. The method of claim 11 wherein the MTJ is part of a magnetic recording head or a MRAM device.

13. The method of claim 11 wherein the MTJ has a bottom spin valve configuration wherein the substrate is a pinned layer comprising one or more of CoFe, CoFeB, CoNiFe, CoNiFeB, or alloys thereof with other elements selected from Ta, Ru, Mg, Hf, Zr, Zn, W, Cu, Ag, and Au.

14. The method of claim 13 wherein the one or more additional layers formed on the uppermost metal layer is a stack comprised of a free layer and a capping layer.

15. The method of claim 11 wherein the first thickness of the first metal layer is between about 4 and 8 Angstroms, the second metal layer has a thickness from about 2 to 4 Angstroms, and the uppermost metal layer has a thickness from about 0.5 to 3 Angstroms.

16. The method of claim 15 wherein a combined thickness of all metal layers used to fabricate the tunnel barrier layer is less than about 9 Angstroms.

17. The method of claim 11 wherein M is selected from Mg, MgZn, Zn, Al, Ti, AlTi, Hf, Zr or a combination thereof.

18. The method of claim 11 further comprised of performing a plasma treatment with an inert gas on the uppermost metal layer before forming the one or more additional layers on the uppermost metal layer.

19. The method of claim 11 further comprised of performing a natural oxidation of the uppermost metal layer that partially oxidizes the uppermost metal layer before forming the one or more additional layers on the uppermost metal layer.

20. The method of claim 11 wherein said annealing process comprises a temperature from about 250° C. to 350° C. and an applied magnetic field of at least 5000 Oe for a period of about 2 to 10 hours.

* * * * *